(12) United States Patent  
Ishii

(10) Patent No.: US 7,932,184 B2  
(45) Date of Patent: Apr. 26, 2011

(54) METHOD OF MANUFACTURING SOLAR CELL MODULE AND SOLAR CELL MODULE THUS MANUFACTURED

(75) Inventor: Yousuke Ishii, Kaizuka (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 311 days.

(21) Appl. No.: 12/211,211

(22) Filed: Sep. 16, 2008

(65) Prior Publication Data
US 2009/0078250 A1    Mar. 26, 2009

(30) Foreign Application Priority Data

Sep. 25, 2007  (JP) .................................. 2007-247898

(51) Int. Cl.
*H01L 21/302* (2006.01)
*H01L 21/461* (2006.01)

(52) U.S. Cl. . 438/753; 438/719; 257/744; 257/E21.077; 257/E21.085; 257/E21.129; 257/E21.134; 257/E27.123; 257/E27.124; 257/E27.125; 257/E27.126; 257/E27.127

(58) Field of Classification Search .................. 438/753, 438/661, 617, 687, 718, 719, 720, 726; 257/744, 257/749, E21.077, E21.085, E21.129, E21.134, 257/E27.123, E27.124, E27.125, E27.126, E27.127

See application file for complete search history.

(56) References Cited

U.S. PATENT DOCUMENTS

| 5,782,994 A * | 7/1998 | Mori et al. ................... 136/251 |
| 2009/0032081 A1 * | 2/2009 | Saita et al. ................... 136/244 |
| 2009/0293934 A1 * | 12/2009 | Okada et al. ................. 136/246 |

FOREIGN PATENT DOCUMENTS

JP    2006-278740 A    10/2006

* cited by examiner

*Primary Examiner* — David Nhu  
(74) *Attorney, Agent, or Firm* — Marvin A. Motsenbocker; Mots Law, PLLC

(57) ABSTRACT

A method of manufacturing a solar cell module, including: forming a laminated body including a first protective member, a first sealing member having a first melting point, a plurality of solar cells, a second sealing member having a second melting point higher than the first melting point, and the second protective member; heating the first sealing member to a temperature equal to or higher than the first melting point but lower than the second melting point; and heating the second sealing member to a temperature equal to or higher than the second melting point. In forming the laminated body, the second sealing member is arranged to form a surface including a plurality of convex portions faces the first sealing member.

2 Claims, 7 Drawing Sheets

FIG. 6
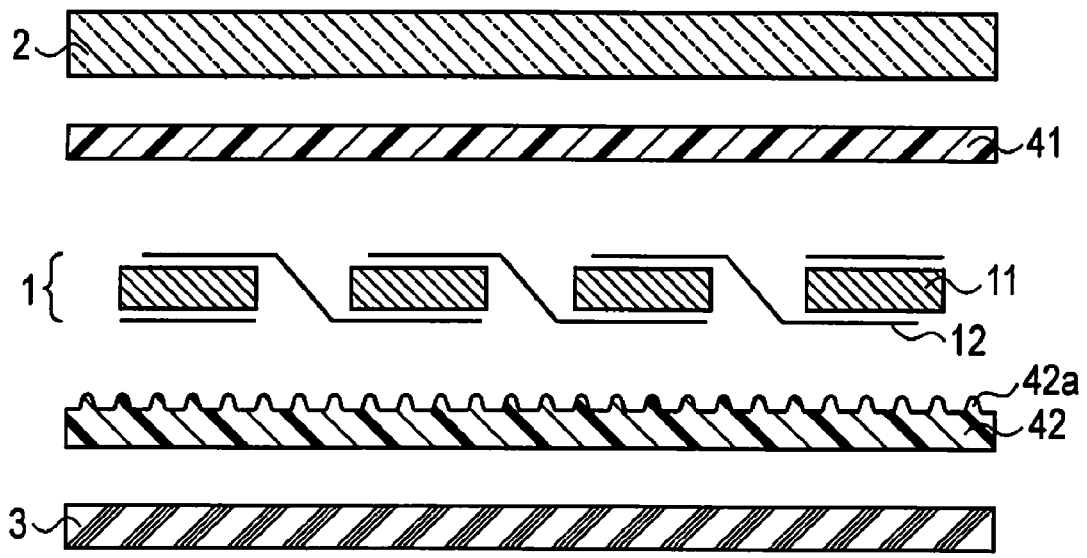
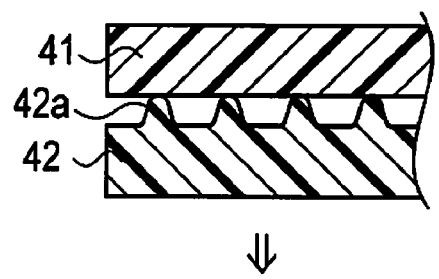
FIG. 7A
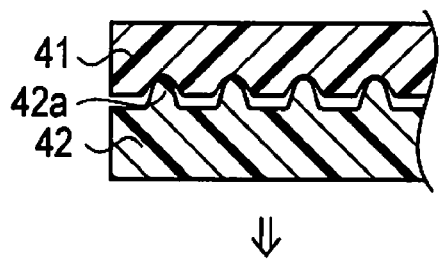
FIG. 7B
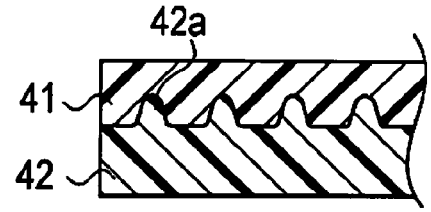
FIG. 7C

METHOD OF MANUFACTURING SOLAR CELL MODULE AND SOLAR CELL MODULE THUS MANUFACTURED

CROSS REFERENCE TO RELATED APPLICATION

This application is based upon and claims the benefit of priority from prior Japanese Patent Application No. 2007-247898, filed on Sep. 25, 2007; the entire contents of which are incorporated herein by reference.

BACKGROUND OF THE INVENTION

1. Field of the Invention

The present invention relates to a method of manufacturing a solar cell module including a plurality of solar cells sealed between a first protective member and a second protective member by using a sealing member that includes a first sealing member having a first melting point and a second sealing member having a second melting point, the second melting point higher than the first melting point, and to the solar cell module thus manufactured.

2. Description of the Related Art

Solar cells are expected as a new energy source that can directly convert clean and inexhaustibly supplied sunlight into electricity.

In general, each solar cell can output an energy of several watts. Accordingly, as a power source for a house, a building or the like, it is common to use a solar cell module that includes a plurality of solar cells connected to one another in order to provide enhanced energy output.

A solar cell module includes a solar cell string sealed between a light-receiving-surface-side protective member and a back-surface-side protective member. Here, the solar cell string indicates a plurality of solar cells connected to one another by using a wiring member.

Conventionally, a concept of sealing the solar cell string by use of two sealing members having different properties has been known.

For example, Japanese Patent Application Publication No. 2006-278740 discloses a sealing member for sealing a solar cell string having a laminated structure in which a first sealing member and a second sealing member are laminated. Here, the melting point of the first sealing member and the melting point of the first sealing member are different. This structure makes it possible to suppress a deterioration of an electrical insulation, on the light-receiving surface or the back surface of the solar cell string, due to a convex portion formed by a wiring member.

In general, sheet-shaped resin members are used as the first sealing member and the second sealing member. In a typical method of manufacturing a solar cell module, the sheet-shaped resin members are formed to have substantially flat and smooth surfaces. As a consequence, an interface between the first and second sealing members is also substantially flat and smooth.

Here, moisture that enters the solar cell module tends to gather at the interface between the first sealing member and the second sealing member having mutually different properties. When the interface between the first sealing member and the second sealing member is substantially flat and smooth, the moisture that gathers at the interface tends to spread and to enter a core portion of the solar cell module. Accordingly, the moisture may reach the plurality of solar cells included in the solar cell string and thereby degrades a power generation capacity of the solar cell module.

SUMMARY OF THE INVENTION

A first aspect of the invention is summarized as a method of manufacturing a solar cell module which includes a plurality of solar cells sealed with a sealing member between a first protective member and a second protective member, the sealing member including a first sealing member having a first melting point and a second sealing member having a second melting point higher than the first melting point. This method includes: forming a laminated body including the first protective member, the sealing member, the plurality of solar cells, and the second protective member; heating the first sealing member to a temperature equal to or higher than the first melting point but lower than the second melting point; and heating the second sealing member to a temperature equal to or higher than the second melting point. In forming the laminated body, the second sealing member is arranged to form a surface having a plurality of convex portions faces the first sealing member.

According to this method of manufacturing the solar cell of the first aspect of the invention, it is possible to form the solar cell module in which the second sealing member is arranged to form a surface including a plurality of convex portions facing the first sealing member. The plurality of convex portions protruding toward the first sealing member prevents the permeated moisture from spreading along the interface between the first sealing member and the second sealing member. Accordingly, it is possible to prevent the moisture that enters the solar cell module from reaching the plurality of solar cells. Therefore, it is possible to suppress the degradation in the power generation capacity of the solar cell module.

A second aspect of the invention is summarized as a solar cell module, including a plurality of solar cells each including a first main surface and a second main surface, the second main surface being located on the opposite side of the first main surface; a first protective member provided on a first main surface side of the plurality of solar cells; a second protective member provided on a second main surface side of the plurality of solar cells; and a sealing member configured to seal the plurality of solar cells between the first protective member and the second protective member. The sealing member includes a first sealing member located on a first protective member side and a second sealing member located on a second protective member side. A first resin material constituting the first sealing member is different from a second resin material constituting the second sealing member. The second sealing member includes a surface including a plurality of convex portions protruding toward the first sealing member.

BRIEF DESCRIPTION OF THE DRAWINGS

FIG. 6 is a view showing a configuration of a laminated body 5 according to the first embodiment of the present invention.

FIGS. 7A to 7C are views showing a process of a plurality of convex portions 42a biting into a first sealing member 41.

DETAILED DESCRIPTION OF THE PREFERRED EMBODIMENTS

Figure 1:
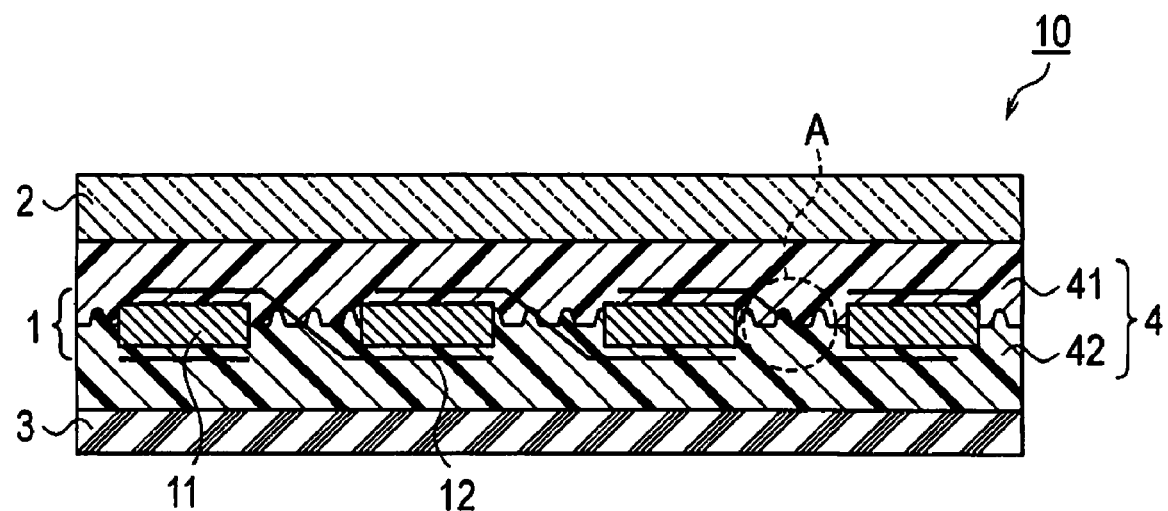
FIG. 1 is a side view of a solar cell module 10 according to a first embodiment of the present invention.

Embodiments of the present invention will be described with reference to the accompanying drawings. In the following description of the drawings, identical or similar constituents are designated by identical or similar reference numerals. It is to be noted, however, that the drawings are merely schematic and proportions of the dimensions and other factors are different from the reality. Therefore, it is to be understood that the concrete dimensions and the like are supposed to be determined in consideration of the following description of the invention. Moreover, as a matter of course, dimensional relations or proportions may vary among the drawings.

First Embodiment

Configuration of Solar Cell Module

A schematic configuration of a solar cell module according to a first embodiment of the present invention will be described below with reference to FIG. 1 and FIG. 2.

FIG. 1 is a cross-sectional view of a solar cell module 10 according to the first embodiment of the present invention.

As shown in FIG. 1, the solar cell module 10 includes a solar cell string 1, a light-receiving-surface-side protective member 2, a back-surface-side protective member 3, and a sealing member 4.

The solar cell string 1 includes a plurality of solar cells 11 and a wiring member 12. In the solar cell string 1, the plurality of solar cells 11 are electrically connected in an arrangement direction to one another by use of the wiring member 12. The configuration of each of the plurality of solar cells 11 will be described later.

The wiring member 12 is connected between a light-receiving surface of one of the plurality of solar cells 11 and a back surface of another one of the plurality of solar cells 11 adjacent to the one of the plurality of solar cells 11. In this way, the one of the plurality of solar cells 11 is electrically connected to the another one of the plurality of solar cells 11. As the wiring member 12, a conductive material such as copper, which is formed either into a thin-plate shape or into a twisted-wire shape, may be used. Here, on a surface of thin-film copper or the like used as the wiring member 12, a soft conductive material such as eutectic solder may be plated.

The light-receiving-surface-side protective member 2 is provided on a light-receiving surface of the sealing member 4 and protects a top surface of the solar cell module 10. As the light-receiving-surface-side protective member 2, a glass having translucent and water-blocking properties, translucent plastic, and the like may be used.

The back-surface-side protective member 3 is provided on the back surface of the sealing member 4, and protects a back surface of the solar cell module 10. As the back-surface-side protective member 3, a resin film such as a PET (polyethylene terephthalate) film or a laminated film having a structure in which an Al foil is sandwiched therebetween, may be used.

The sealing member 4 seals the solar cell string 1 between the light-receiving-surface-side protective member 2 and the back-surface-side protective member 3.

As shown in FIG. 1, the sealing member 4 has a laminated structure in which a first sealing member 41 located on a side of the light-receiving-surface-side protective member 2, and a second sealing member 42 located on a side of the back-surface-side protective member 3, are laminated.

Figure 2:
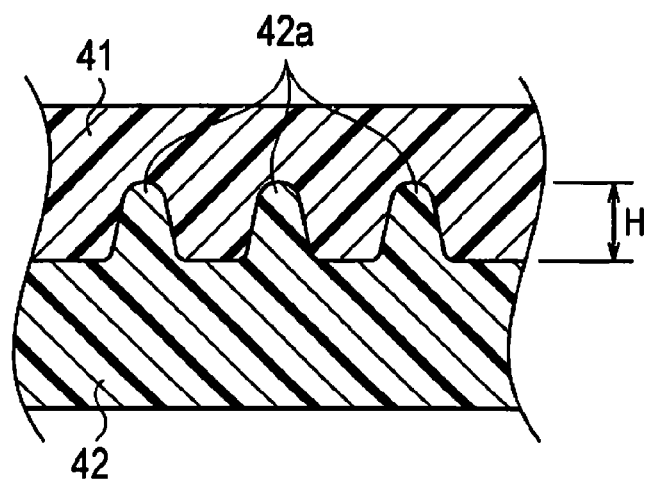
FIG. 2 is an enlarged view of a portion A in FIG. 1.

FIG. 2 is an enlarged view of a portion A of FIG. 1. As shown in FIG. 2, the second sealing member 42 has a surface including a plurality of convex portions 42a protruding toward the first sealing member.

The first sealing member 41 and the second sealing member 42 are made of different resin materials. As the first sealing member 41 or the second sealing member 42, any of resins including olefin resins such as polyethylene and polypropylene, and other resins such as EVA, EEA, PVB, silicone, urethane, acryl and epoxy resins may be used. However, the material is not limited only to the foregoing. It is preferable that a resin material having translucency, ultraviolet resistance, and the like is used as the first sealing member 41. Meanwhile, as the second sealing member 42, the resin material having translucency and ultraviolet resistance as similar to the first sealing member 41, or a material having moisture resistance instead of translucency or ultraviolet resistance, may be used.

Here, the resin material constituting the first sealing member 41 has a different melting point from the resin material constituting the second sealing member 42.

It should be noted that an Al frame (not shown) may be attached to an outer periphery of the solar cell module 10 having the above-described configuration.

(Configuration of Solar Cell)

Figure 3:
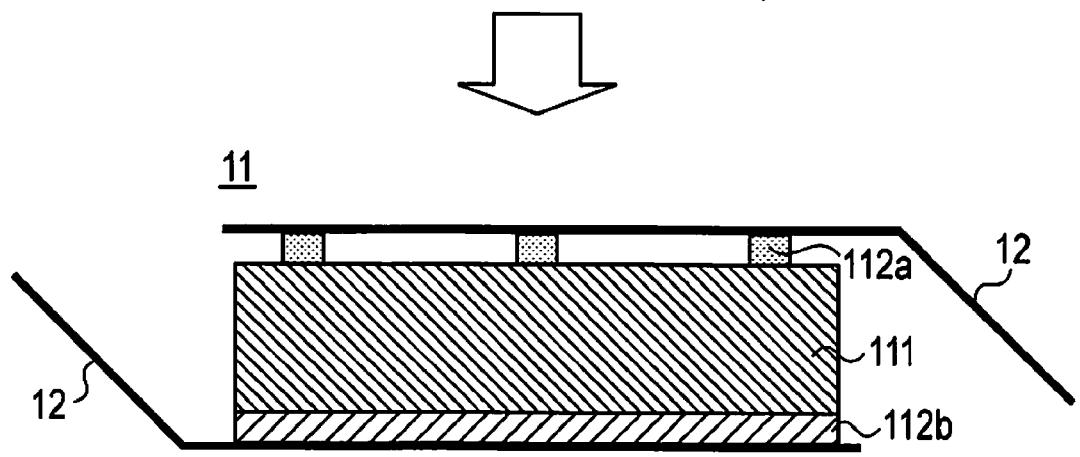
FIG. 3 is a cross-sectional view of each of the plurality of solar cells 11 according to the first embodiment of the present invention.

Next, a configuration of each of the plurality of solar cells 11 will be described with reference to FIG. 3 and FIG. 4. FIG. 3 is a cross-sectional view of one of the plurality of solar cells 11 according to the first embodiment of the present invention. Meanwhile, FIG. 4 is a top plan view of one of the plurality of solar cells 11 according to the first embodiment of the present invention.

Figure 4:
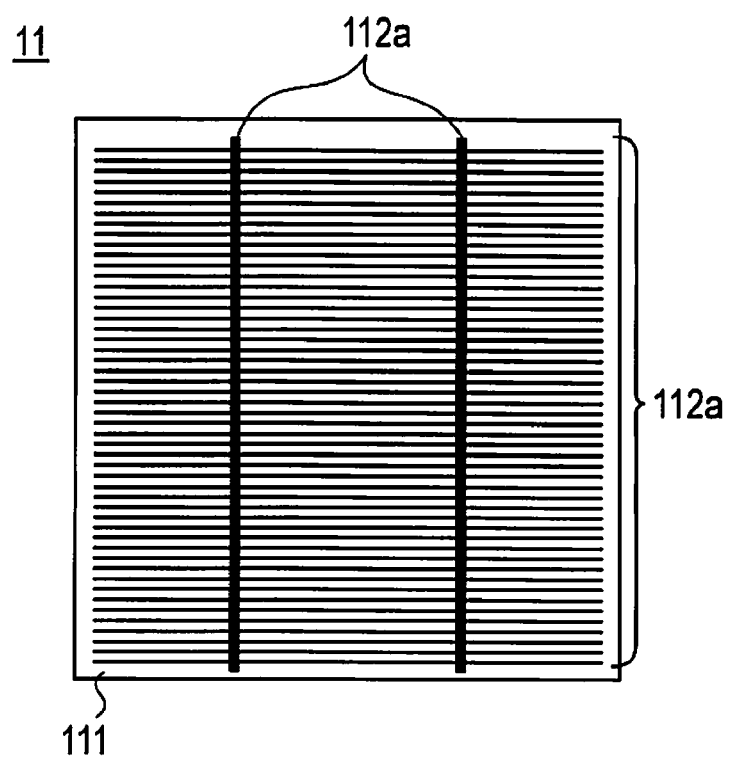
FIG. 4 is a top view of each of the plurality of solar cells 11 according to the first embodiment of the present invention.

As shown in FIG. 3 and FIG. 4, each of the plurality of solar cells 11 includes a photoelectric conversion part 111 and a collecting electrode 112.

The photoelectric conversion part 111 generates photogenerated carriers by receiving solar light on a light-receiving surface. Here, the photogenerated carriers are referred to electron holes and electrons generated by the solar light absorbed by the photoelectric conversion part 111.

The photoelectric conversion part 111 includes an n-type region and a p-type region, and a semiconductor junction is formed at an interface portion between the n-type region and the p-type region in the photoelectric conversion part 111. The photoelectric conversion part 111 may be formed by use of a semiconductor substrate made of a semiconductor material including a crystalline semiconductor material such as single-crystal Si or polycrystalline Si, a compound semiconductor material such as GaAs or InP, or the like. Here, the photoelectric conversion part 111 may include a structure (so-called a HIT structure) in which a substantially intrinsic amorphous silicon layer is interposed between a single-crystal silicon substrate and an amorphous silicon layer to reduce defects at the interface therebetween, and thereby to improve a heterojunction interface characteristic.

The collecting electrode 112 include a light-receiving-surface-side collecting electrode 112a bonded to the light-receiving surface of the photoelectric conversion part 111 and a back surface electrode 112b bonded to the back surface of the photoelectric conversion part 111. The light-receiving-surface-side collecting electrode 112a and the back surface electrode 112b collect the photogenerated carriers generated by the photoelectric conversion part 111. Here, the wiring member 12 is connected to the light-receiving-surface-side collecting electrode 112a of one of the plurality of solar cells 11 and to the back surface electrode 112b of another one of the plurality of solar cells 11 adjacent to the one of the plurality of solar cells 11.

Here, the light-receiving-surface-side collecting electrode 112a has the smallest possible area so as to increase the area where the photoelectric conversion part 111 can receive light, i.e., to maximize the exposed area of the photoelectric conversion part 111. For example, as shown in FIG. 3 and FIG. 4, the light-receiving-surface-side collecting electrode 112a is formed into a comb shape or a so-called finger shape, by reducing the electrode width. Meanwhile, in FIG. 3, the back surface electrode 112b is formed on the entire back surface of the photoelectric conversion part 111. However, the back surface electrode 112b may be formed into a comb shape as similar to the light-receiving-surface-side collecting electrode 112a. The light-receiving-surface-side collecting electrode 112a and the back surface electrode 112b may be formed by using resin-based conductive paste that employs a resin material as a binder and conductive particles such as silver particles as a filler. However, the material for the electrodes is not limited to the foregoing.

(Method of Manufacturing Solar Cell Module)

Next, a method of manufacturing a solar cell module according to the first embodiment of the present invention will be described with reference to FIGS. 5 to 6 and FIGS. 7A to 7C.

Figure 5:
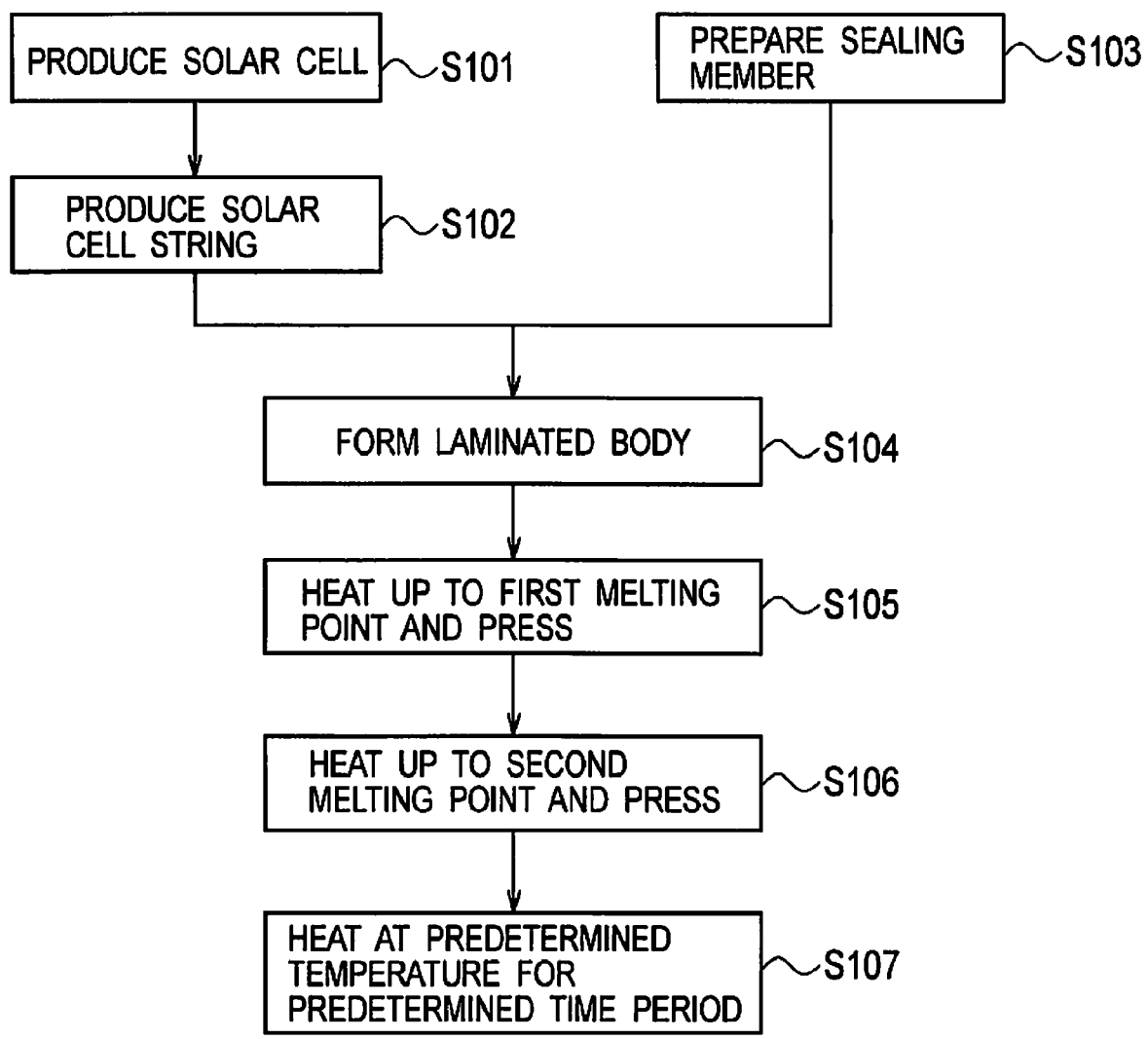
FIG. 5 is a flowchart showing an outline of a manufacturing process for the solar cell module 10 according to the first embodiment of the present invention.

FIG. 5 is a flowchart showing a process for manufacturing the solar cell module 10 according to the first embodiment of the present invention.

In Step S101, each of the plurality of solar cells 11 is produced. To be more specific, the photoelectric conversion part 111 is formed in the first place. Next, the light-receiving-surface-side collecting electrode 112a is formed on the light-receiving surface of the photoelectric conversion part 111. Similarly, the back surface electrode 112b is formed on the back surface of the photoelectric conversion part 111. In this way, each of the plurality of solar cells 11 is produced.

In Step S102, the solar cell string 1 is produced. To be more specific, the wiring member 12 is bonded between the light-receiving-surface-side collecting electrode 112a of one of the plurality of solar cells 11 and the back surface electrode 112b of another one of the plurality of solar cells 11 adjacent to the one of the plurality of solar cells 11. In this way, the one of the plurality of solar cells 11 is electrically connected to the other one of the plurality of solar cells 11, thereby producing the solar cell string 1.

In Step S103, the sealing member 4 is prepared. Step S103 may be performed prior to or in parallel with Steps S101 and S102. To be more specific, the first sealing member 41 and the second sealing member 42 are prepared. Here, the melting point (a second melting point) of the second sealing member 42 is higher than the melting point (a first melting point) of the first sealing member 41. Further, the second sealing member 42 has a plurality of convex portions 42a at least on one of the surfaces of the second sealing member 42.

In Step S104, a laminated body 5 is formed by sequentially laminating the light-receiving-surface-side protective member 2, the first sealing member 41, the solar cell string 1, the second sealing member 42, and the back-surface-side protective member 3. FIG. 6 shows the configuration of the laminated body 5. Here, as shown in FIG. 6, the second sealing member 42 is provided so that the surface of the second sealing member 42 provided with the plurality of convex portions 42a can face the surface of the first sealing member 41.

In Step S105, the laminated body 5 is heated and pressed under a vacuum atmosphere. To be more specific, the laminated body 5 is pressed and heated, so that the temperature of the first sealing member 41 and the second sealing member 42 of the laminated body 5 becomes equal to or higher than the first melting point but lower than the second melting point. In this way, the solar cell string 1 is press-bonded to the light-receiving-surface-side protective member 2 via the first sealing member 41. Meanwhile, the plurality of convex portions 42a on the second sealing member 42 bites into the first sealing member 41.

FIGS. 7A to 7C are views showing a process of the plurality of convex portions 42a on the second sealing member 42 biting into the first sealing member 41 in Step S105.

In FIG. 7A, the temperature of the first sealing member 41 and the second sealing member 42 is lower than the first melting point. In this state, neither the first sealing member 41 nor the second sealing member 42 is softened. Accordingly, even when the laminated body 5 is pressed, the plurality of convex portions 42a on the second sealing member 42 does not bite into the first sealing member 41.

When the temperature of the first sealing member 41 and the second sealing member 42 reaches the temperature range equal to or higher than the first melting point but lower than the second melting point, the first sealing member 41 having the first melting point is softened. However, the second sealing member 42 having the second melting point 42 is not softened. Accordingly, by continuously heating and pressing for a predetermined time period, the plurality of convex portions 42a on the second sealing member 42 gradually bite into the first sealing member 41 as shown in FIG. 7B and FIG. 7C.

Note that, in Step S105, it is preferable that the first sealing member 41 is heated at the lowest possible temperature within the temperature range equal to or higher the first melting point but lower than the second melting point.

In Step S106, the laminated body 5 is heated up to the second melting point, and pressed in a vacuum atmosphere. In this way, the solar cell string 1 is press-bonded to the back-surface-side protective member 3 via the first sealing member 42. Thus, the laminated body 5 is therefore integrated.

In Step S107, the laminated body 5 is heated at a predetermined temperature for a predetermined period of time. In this way, the sealing member 4 is completely hardened. In this way, the solar cell module 10 is manufactured.

Operations and Effects

According to the method of manufacturing the solar cell module 10 of the first embodiment of the present invention, the laminated body 5 including the first sealing member 41 and the second sealing member 42 is pressed and heated so that the temperature of the first sealing member 41 and the second sealing member 42 becomes equal to or higher than the melting point (the first melting point) of the first sealing member 41 but lower than the melting point (the second melting point) of the second sealing member 42. Here, the second sealing member 42 has the flat portion and the plurality of convex portions 42a on the surface facing the first sealing member 41. Then, the laminated body 5 is pressed and heated so that the temperature of the second sealing member 42 becomes equal to or higher than the melting point (the second melting point) of the second sealing member 42. According to this method of manufacturing the solar cell module 10, it is possible to form the solar cell module 10 including the second sealing member 42 having the plurality of convex portions 42a protruding toward the first sealing member 41.

The plurality of convex portions 42a protruding toward the first sealing member 41 prevents the permeated moisture from spreading along the interface between the first sealing member 41 and the second sealing member 42. Accordingly, since the second sealing member 42 has the surface including the plurality of convex portions 42a protruding toward the first sealing member 41, it is possible to prevent the moisture that enters the solar cell module 10 from reaching the plurality of solar cells 11 included in the solar cell string 1. Therefore, it is possible to suppress the degradation in the power generation capacity of the solar cell module 10.

Other Embodiments

Although the present invention has been described above in accordance with the above-described embodiment, it is to be understood that the description and the drawings constituting part of this disclosure do not limit the scope of the invention. It is obvious to those skilled in the art that various other embodiments, examples, and technical applications are possible from the teachings of this disclosure.

For example, according to the above-described first embodiment, the first sealing member 41 is provided between the solar cell string 1 and the light-receiving-surface-side protective member 2, and the second sealing member 42 is provided between the solar cell string 1 and the back-surface-side protective member 3. However, the present invention is not limited only to this configuration. It is also possible to provide the first sealing member 41 between the solar cell string 1 and the back-surface-side protective member 3 and to provide the second sealing member 42 between the solar cell string 1 and the light-receiving-surface-side protective member 2.

Figure 8A:
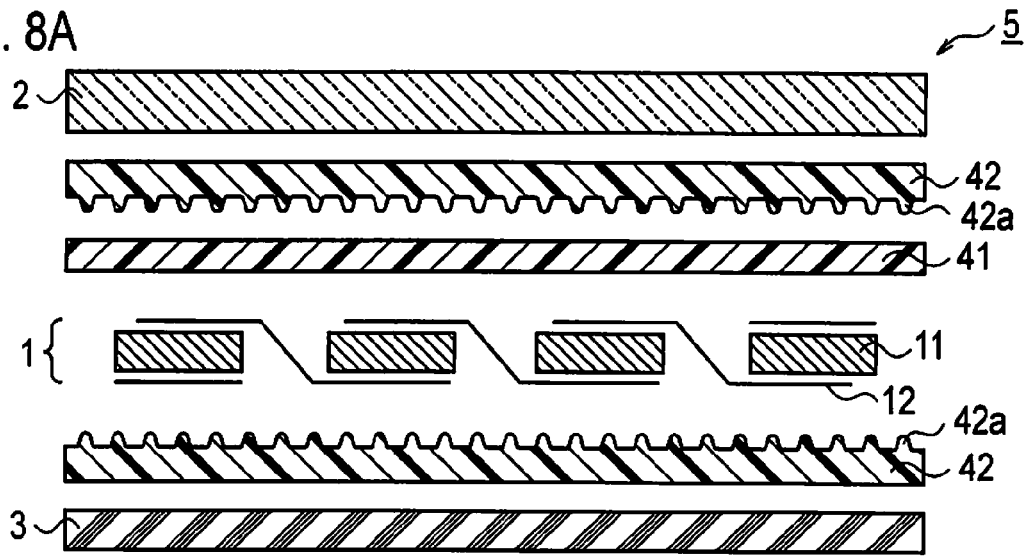
FIGS. 8A to 8C are views showing a configuration of a laminated body 5 according to other embodiment (No. 1).
Figure 8B:
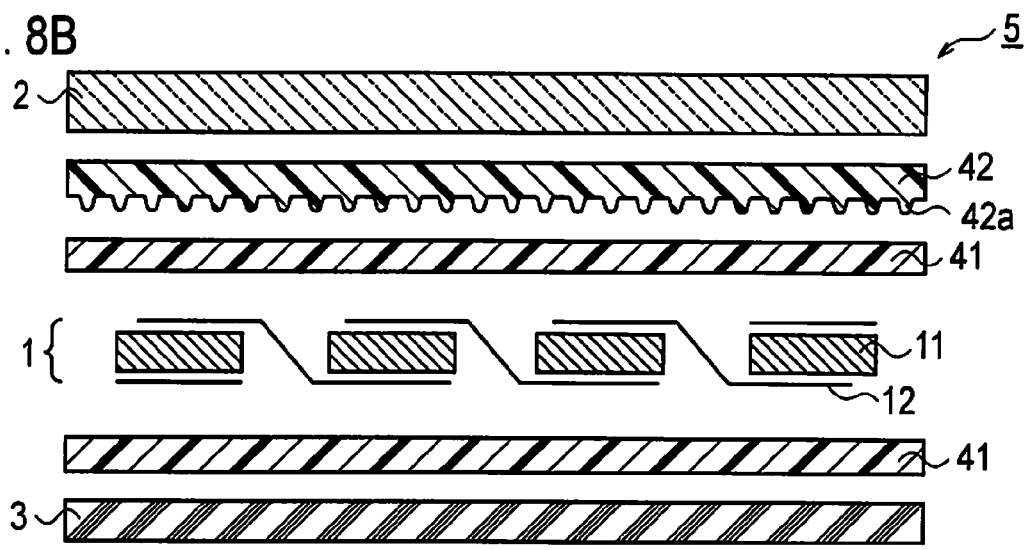
Figure 8C:
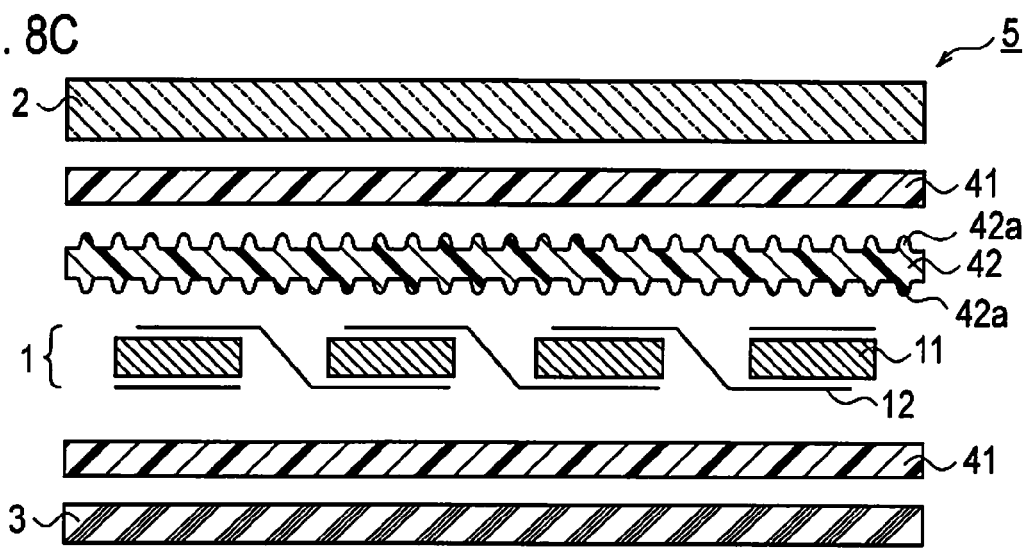
Figure 9:
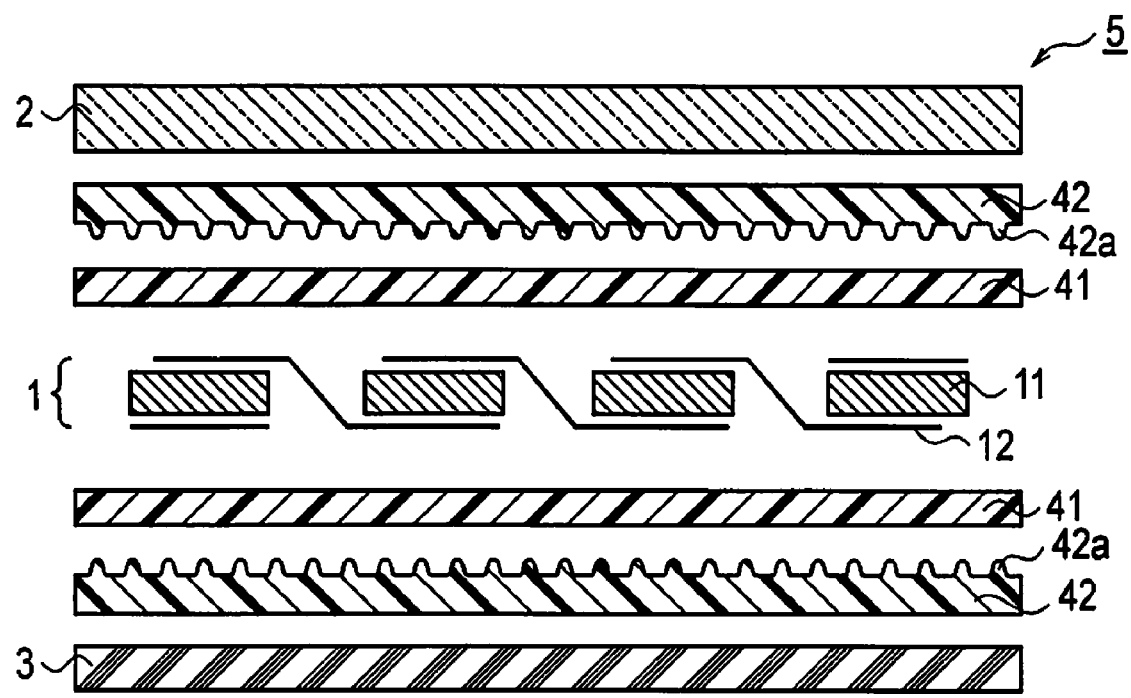
FIG. 9 is a view showing a configuration of a laminated body 5 according to other embodiment (No. 2).

Meanwhile, according to the above-described first embodiment, only the first sealing member 41 is provided between the solar cell string 1 and the light-receiving-surface-side protective member 2 while only the second sealing member 42 is provided between the solar cell string 1 and the back-surface-side protective member 3. However, the present invention is not limited only to this configuration. To be more specific, as shown in FIGS. 8A to 8C, the first sealing member 41 and the second sealing member 42 may be laminated between the solar cell string 1 and the light-receiving-surface-side protective member 2, or between the solar cell string 1 and the back-surface-side protective member 3. In particular, when the first sealing members 41 are provided on both sides of the second sealing member 42 as shown in FIG. 8C, it is preferable to provide the plurality of convex portions 42a on both sides of the second sealing member 42. Meanwhile, as shown in FIG. 9, the first sealing member 41 and the second sealing member 42 may be laminated on both of the space between the solar cell string 1 and the light-receiving-surface-side protective member 2, and between the solar cell string 1 and the back-surface-side protective member 3.

Moreover, according to the above-described first embodiment, the sealing member 4 includes two types of resin materials. However, the present invention is not limited only to this configuration. To be more specific, the sealing member 4 may be formed by using three or more types of resin materials. For example, as shown in FIG. 8A, any one of the second sealing member 42 provided between the solar cell string 1 and the back-surface-side protective member 3, and the second sealing member 42 provided between the light-receiving-surface-side protective member 2 and the first sealing member 41 may be replaced by a third sealing member made of a third type of resin material. Similarly, any one of the two first sealing members shown in FIG. 8B or in FIG. 8C may be replaced by the third sealing member made of the third type of resin material.

Figure 10A:
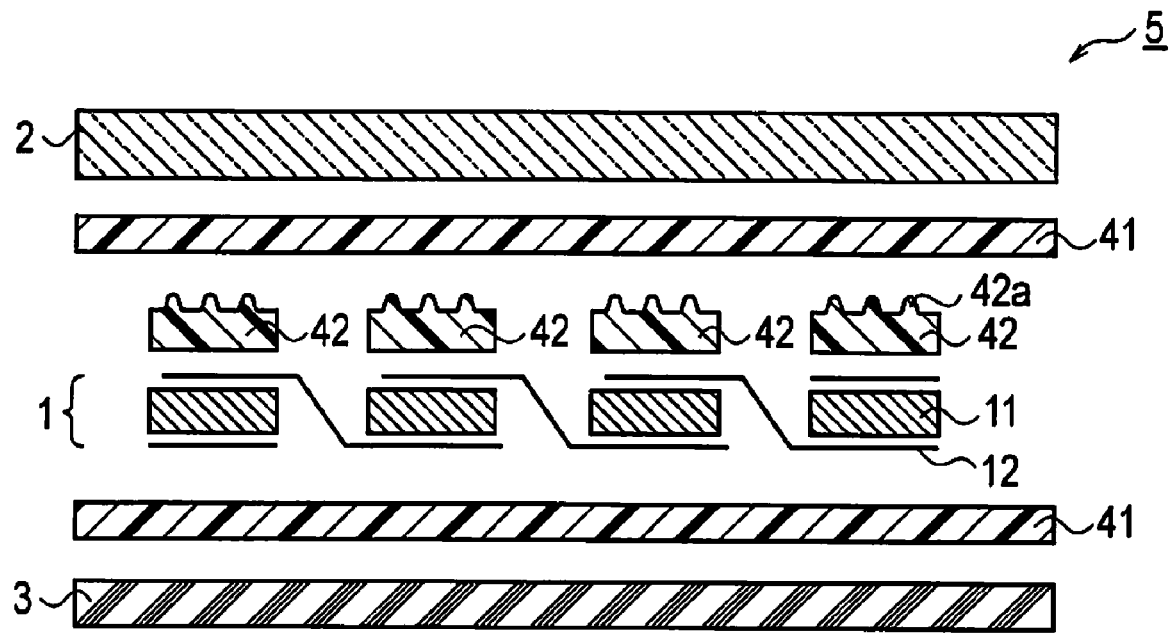
FIGS. 10A and 10B are views showing a configuration of a laminated body 5 according to other embodiment (No. 3).
Figure 10B:
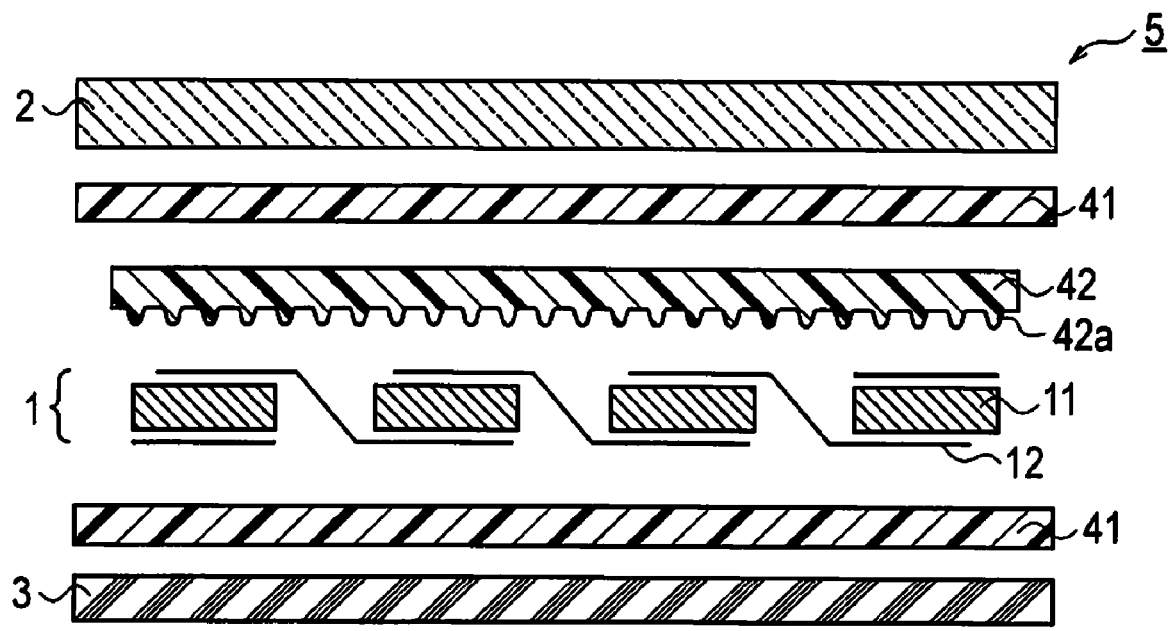

Further, according to the first embodiment, the first sealing member 41, the second sealing member 42, the light-receiving-surface-side protective member 2, and the back-surface-side protective member 3 have substantially the same shape. However, the present invention is not limited only to this configuration. To be more specific, as shown in FIG. 10A, the second sealing member 42 may be formed by substantially the same shape as each of the plurality of solar cells 11. Alternatively, as shown in FIG. 10B, the second sealing member 42 may be formed slightly smaller than the first sealing member 41.

As described above, it is needless to say that the present invention encompasses various other embodiments that are not expressly stated herein. In this context, the technical scope of the present invention shall be determined only by the matters to specify the invention to be reasonably defined by the appended claims in conjunction with the foregoing description.

EXAMPLES

Hereinafter, the method of manufacturing the solar cell module according to the present invention will be concretely described based on an example. It is to be noted, however, that the present invention will not be limited only to the example below, and that various modifications are possible without departing from the scope of the invention.

Example

A solar cell module according to an example was produced as described below.

Firstly, the plurality of solar cells each including the photoelectric conversion part and the collecting electrodes were prepared. Next, the solar cell string was formed by connecting the plurality of solar cells to one another by using the wiring member.

Next, two types of the sealing materials are prepared. To be more specific, an EVA resin member having the melting point approximately equal to 76° C. (the first sealing member 41) and an olefin resin member having the melting point approximately equal to 90° C. (the second sealing member 42) were prepared. Here, as shown in FIG. 2, the olefin resin member (the second sealing member 42) having a plurality of convex portions 42a each having a height H of approximately 6 μm provided on at least one of the surfaces was prepared. Meanwhile, the EVA resin member (the first sealing member 41) having a plurality of convex portions each having a height of 6 to 7 μm provided at least on one of the surfaces was prepared. Here, a cross-linking agent was contained in the EVA resin member (the first sealing member 41).

Next, a glass plate (the light-receiving-surface-side protective member 2) and a PET sheet (the back-surface-side protective member 3) having substantially the same shape as the EVA resin member (the first sealing member 41) and the olefin resin member (the second sealing member 42) were prepared.

Next, the EVA resin member (the first sealing member 41), the solar cell string, the olefin resin member (the second sealing member 42), and the PET sheet (the back-surface-side protective member 3) were sequentially laminated on the glass plate (the light-receiving-surface-side protective member 2) to form the laminated body. Here, the olefin resin member (the second sealing member 42) was provided such that the plurality of convex portions 42a were provided on the surface of the olefin resin member (the second sealing member 42) facing the surface of the EVA resin member (the first sealing member 41).

Next, in a vacuum atmosphere, the laminated body was pressed and heated so that the temperature of the EVA resin member (the first sealing member 41) included in the laminated body became equal to or higher than 76° C. but lower than 90° C.

Next, in the vacuum atmosphere, the laminated body was pressed and heated so that the temperature of the olefin resin member (the second sealing member 42) included in the laminated body became equal to or higher than 90° C.

Then, the laminated body was heated at a temperature around 150° C., thereby completely hardening the EVA resin member (the first sealing member 41) and the olefin resin member (the second sealing member 42).

According to this example, the solar cell module including the olefin resin member (the second sealing member 42) including, on the surface in contact with the EVA resin member (the first sealing member 41), the plurality of convex portions 42a protruding toward the EVA resin member (the first sealing member 41) was formed as shown in FIG. 2.

Comparative Example

A solar cell module of a comparative example was produced as described below.

First, the solar cell string similar to the one in the above-described example was formed.

Next, two types of the sealing materials were prepared. To be more specific, EVA resin member having the melting point approximately equal to 76° C. (the first sealing member 41) and olefin resin member having the melting point approximately equal to 90° C. (the second sealing member 42) were prepared. In this comparative example, the EVA resin member (the first sealing member 41) having a plurality of convex portions each having a height from 6 to 7 µm provided on at least one of the surfaces was prepared as similar to the above-described example. Here, a cross-linking agent was contained in the EVA resin member (the first sealing member 41). However, in this comparative example, the olefin resin member (the second sealing 42) prepared herein was not provided with a plurality of convex portions 42a on the surface facing the EVA resin member (the first sealing member 41).

Next, the glass plate (the light-receiving-surface-side protective member 2) and the PET sheet (the back-surface-side protective member 3) having substantially the same shape as the EVA resin member (the first sealing member 41) and the olefin resin member (the second sealing member 42) were prepared.

Next, the EVA resin member (the first sealing member 41), the solar cell string, the olefin resin member (the second sealing member 42), and the PET sheet (the back-surface-side protective member 3) were sequentially laminated on the glass plate (the light-receiving-surface-side protective member 2) to form the laminated body. Here, the olefin resin member (the second sealing member 42) does not include the convex portion 42a on the surface of the olefin resin member (the second sealing member 42) facing the surface of the EVA resin member (the first sealing member 41).

Next, in a vacuum atmosphere, the laminated body was pressed and heated so that the temperature of the EVA resin member (the first sealing member 41) included in the laminated body became equal to or higher than 76° C. but lower than 90° C.

Next, in the vacuum atmosphere, the laminated body was pressed and heated so that the temperature of the olefin resin member (the second sealing member 42) included in the laminated body became equal to or higher than 90° C. Here, the softened olefin resin member (the second sealing member 42) was closely attached to the PET sheet (the back-surface-side protective member 3) whereby the entire laminated body was tentatively bonded together.

Next, the laminated body was heated at a temperature around 150° C., thereby completely hardening the EVA resin member (the first sealing member 41) and the olefin resin member (the second sealing member 42).

As described above, the solar cell module having the flat interface between the EVA resin member (the first sealing member 41) and the olefin resin member (the second sealing member 42) was formed in this comparative example.

(Moisture Resistance Test)

A moisture resistance test was performed on the solar cell modules according to the example and the comparative example, respectively. Table 1 shows output values of the solar cell modules of the example and the comparative example before and after the moisture resistance test. Testing conditions were as follows; the temperature was 85° C., the humidity was 85%, and a testing time period was 1000 hours. Note that, in Table 1, the output values of the example and the comparative example were standardized by defining the respective values before the moisture test equal to 1.000.

TABLE 1

Output values before and after moisture resistance test (standardized by defining the values before the test equal to 1.000)

| | Before moisture resistance test | After moisture resistance test |
|---|---|---|
| Example | 1.000 | 0.815 |
| Comparative Example | 1.000 | 0.800 |

As shown in FIG. 1, the output value of the solar cell module according to the comparative example after the moisture resistance test was equal to 80.0% relative to the output value before the moisture resistance test. Meanwhile, the output value of the solar cell module according to the example after the moisture resistance test succeeded in retaining 81.5% relative to the output value before the moisture resistance test.

From this result, it is confirmed that the olefin resin member (the second sealing member 42) including, on the surface in contact with the EVA resin member (the first sealing member 41), the plurality of convex portions 42a protruding toward the EVA resin member (the first sealing member 41) can provide the solar cell module that is capable of suppressing degradation in the power generation capacity.

What is claimed is:

1. A method of manufacturing a solar cell module which includes
a plurality of solar cells sealed with a sealing member between a first protective member and a second protective member, the sealing member including a first sealing member having a first melting point and a second sealing member having a second melting point higher than the first melting point, the method comprising:

forming a laminated body including the first protective member, the sealing member, the plurality of solar cells, and the second protective member;

heating the first sealing member to a temperature equal to or higher than the first melting point but lower than the second melting point; and heating the second sealing member to a temperature equal to or higher than the second melting point, wherein in forming the laminated body, the second sealing member is arranged to form a surface including a plurality of convex portions facing the first sealing member.

2. A solar cell module, comprising:

a plurality of solar cells each including a first main surface and a second main surface, the second main surface being located on an opposite side of the first main surface;

a first protective member provided on a first main surface side of the plurality of solar cells;

a second protective member provided on a second main surface side of the plurality of solar cells; and a sealing member configured to seal the plurality of solar cells between the first protective member and the second protective member, wherein the sealing member includes a first sealing member located on a first protective member side and a second sealing member located on a second protective member side, a first resin material constituting the first sealing member is different from a second resin material constituting the second sealing member, and the second sealing member has a surface including a plurality of convex portions protruding toward the first sealing member.

* * * * *